United States Patent
Pirk et al.

(10) Patent No.: US 10,217,926 B2
(45) Date of Patent: Feb. 26, 2019

(54) METHOD FOR PRODUCING A MULTI-LAYER ELECTRODE SYSTEM

(71) Applicant: Robert Bosch GmbH, Stuttgart (DE)

(72) Inventors: Tjalf Pirk, Stuttgart (DE); Andreas Krauss, Tuebingen (DE); Friedjof Heuck, Stuttgart (DE); Stefan Leidich, Rutesheim (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 721 days.

(21) Appl. No.: 14/759,137

(22) PCT Filed: Jan. 10, 2014

(86) PCT No.: PCT/EP2014/050372
§ 371 (c)(1),
(2) Date: Jul. 2, 2015

(87) PCT Pub. No.: WO2014/108499
PCT Pub. Date: Jul. 17, 2014

(65) Prior Publication Data
US 2015/0340592 A1    Nov. 26, 2015

(30) Foreign Application Priority Data
Jan. 14, 2013   (DE) ................. 10 2013 200 354

(51) Int. Cl.
*H01L 41/08*   (2006.01)
*H01L 41/293*  (2013.01)
(Continued)

(52) U.S. Cl.
CPC .......... *H01L 41/081* (2013.01); *H01L 41/083* (2013.01); *H01L 41/0815* (2013.01);
(Continued)

(58) Field of Classification Search
CPC ............... H01L 41/081; H01L 41/0815; H01L 41/0831; H01L 41/27; H01L 41/293; H01L 41/297; H01L 21/311; H01L 21/31116; H01L 41/083; Y10T 29/42; Y10T 29/43
See application file for complete search history.

(56) References Cited

U.S. PATENT DOCUMENTS 5,691,594 A   11/1997   Takeuchi et al.
6,289,564 B1   9/2001   Novotny
(Continued)

FOREIGN PATENT DOCUMENTS

CN          1877878 A        12/2006
DE    10 2010 029 282 A1    12/2011
(Continued)

OTHER PUBLICATIONS

International Search Report corresponding to PCT Application No. PCT/EP2014/050372, dated Apr. 23, 2014 (German and English language document) (5 pages).

*Primary Examiner* — A. Dexter Tugbang
(74) *Attorney, Agent, or Firm* — Maginot, Moore & Beck LLP (57) ABSTRACT

A method for producing a multi-layer electrode system includes providing a carrier substrate having a recess in a top side of the carrier substrate. At least one wall of the recess is inclined in relation to a bottom side of the carrier substrate, which is opposite to the top side. The method also includes applying a multi-layer stack, which includes at least a first electrode layer, a second electrode layer, and a piezoelectric layer arranged between the first electrode layer and the second electrode layer, to the top side of the carrier substrate. At least the wall and a bottom of the recess are covered by at least a portion of the multi-layer stack.

11 Claims, 5 Drawing Sheets

(51) Int. Cl.
    *H01L 41/297* (2013.01)
    *H01L 41/083* (2006.01)
    *H01L 41/27* (2013.01)
    *H01L 21/311* (2006.01)

(52) U.S. Cl.
    CPC .......... *H01L 41/0831* (2013.01); *H01L 41/27* (2013.01); *H01L 41/293* (2013.01); *H01L 41/297* (2013.01); *H01L 21/311* (2013.01); *H01L 21/31116* (2013.01); *Y10T 29/42* (2015.01); *Y10T 29/43* (2015.01)

(56) References Cited

U.S. PATENT DOCUMENTS

| | | | |
|---|---|---|---|
| 7,003,857 B1* | 2/2006 | Shimada | Y10T 29/42 219/121.69 |
| 8,186,029 B2* | 5/2012 | Norimatsu | Y10T 29/42 29/25.35 |
| 8,776,335 B2* | 7/2014 | Baumgartner | Y10T 29/42 29/25.35 |
| 2006/0115952 A1 | 6/2006 | Wu | |
| 2006/0226120 A1* | 10/2006 | Rusu | H01L 21/31116 216/67 |
| 2011/0294015 A1 | 12/2011 | Pirk et al. | |

FOREIGN PATENT DOCUMENTS

| | | |
|---|---|---|
| EP | 0 851 475 A2 | 7/1998 |
| JP | 2010045333 A * | 2/2010 |
| WO | 2011/090440 A1 | 7/2011 |
| WO | 2012/060927 A1 | 5/2012 |

\* cited by examiner

Fig. 9

METHOD FOR PRODUCING A MULTI-LAYER ELECTRODE SYSTEM

This application is a 35 U.S.C. § 371 National Stage Application of PCT/EP2014/050372, filed on Jan. 10, 2014, which claims the benefit of priority to Serial No. DE 10 2013 200 354.4, filed on Jan. 14, 2013 in Germany, the disclosures of which are incorporated herein by reference in their entireties.

BACKGROUND

The present disclosure relates to a multi-layer electrode system and a method for producing a multi-layer electrode system, to a corresponding apparatus and also to a corresponding computer program product.

Piezoelectrical materials have the particular characteristic that when an electrical field is applied, said materials either expand or contract, or rather as an inverse effect an electrical field is produced as soon as the material is caused to expand or shrink. Piezoelectrical materials are used in actuator technology in order to develop highly precise positioners. By way of example, a PZT actuator can be used in order to operate a gyroscope. Piezoelectrical materials provide an elegant option for a sensor to convert the smallest length changes directly into an electrical signal.

Finally, piezoelectrical materials are widely used in micro-energy harvesters. In this case, mainly accelerations in the form of vibrations are converted into electrical energy.

There are currently two different approaches available for producing piezoelectrical elements in multi-layers. In a first method, piezoelectrical multi-layers are generated using thick-film technology. The multi-layers are configured in such a manner that in each case one layer of piezoelectrical material lies between two respective layers of electrodes. Since the piezoelectrical effect depends upon the electrical field, the necessary applied electrical voltage can be divided by the number of individual layers. The voltage is applied in such a manner that one half of the electrode layers in other words each second electrode layer is connected to the other half. The electrodes contact a multi-layer component by way of a thick-film structuring during the electrode deposition and a metallization of the end surface of the multi-layer component. The thinnest layers that can be achieved in the thick film are approximately 20 µm, wherein the PZT when using the thick-film technology has breakdown field strength of approx. 2 V/µm. This means that voltages of approx. 40 V are required in order to work with field strengths in the region of the breakdown and this result in the largest mechanical adjusting paths.

The thin-film technology used in microsystems technology mainly only renders it possible to use a single layer that has only one piezoelectrical layer. Two different methods are available for the deposition of the piezoelectrical material, on the one hand an application process based on sol gel or on the other to perform the deposition process in a vacuum. The layer thicknesses that are created using these methods are a few 100 nm up to 10 µm. As a result of the higher quality of the thin layers, the breakdown strengths are approx. 10 V/µm. Consequently, voltages of up to 10 V at a layer thickness of 1 µm are sufficient in order to work at the limit up to the breakdown. It is of advantage particularly when performing the deposition process in a vacuum that alternating electrode material and piezoelectrical material can be deposited in one machine in one process and it is possible as a result to create multi-layers.

One known approach for producing an electrical contact is to make contact with individual electrodes in an alternating manner. In so doing, each electrode is structured individually calibrated in a photolithographical manner. For a technically expedient implementation, it is possible using this method to produce a multi-layer that has up to five layers.

A further option provides a movable shadow mask. In this case, when performing the electrode deposition process in a vacuum, a hard mask is moved across the substrate, and the electrode is only deposited in open regions of the mask. The mask is removed for the subsequent piezoelectrical deposition and re-positioned in an offset manner when depositing the next electrode.

US 2011/0294015 A1 describes a method for producing a thin-film battery. A first electrode material, a battery material and a second electrode material are repeatedly deposited one after another on a carrier structure without using a mask in order to form a thin-film battery that has a plurality of first electrode layers, battery layers and second electrode layers.

SUMMARY

On the basis of this background, the present disclosure proposes a method for producing a multi-layer electrode system, furthermore an apparatus that is used by this method, and also finally a corresponding computer program product in accordance with the following description. Advantageous embodiments are evident in the the description hereinunder.

A method for producing a multi-layer electrode system uses a carrier substrate, wherein at least one wall of a recess for receiving a multi-layer stack is embodied in an inclined manner in said carrier substrate. It is thus possible in a simple manner to make contact with the electrodes individually in a planar manner from above.

In accordance with the proposed concept, a contacting method can be created whereby an alternating multi-layer electrode structure can be demonstrated using thin-film technology. It is also possible for this to provide a cost-effective method that merely requires a small number of lithography steps and does not require any interruption in or modification to the vacuum deposition process. A method of this type comprises the advantage that it is relatively insensitive to the number of multi-layers that are to be contacted, in other words it can be scales to suit many layers. Consequently, the proposed method provides an option to use microsystem technology to contact alternating multi-layer electrode systems such as for example piezoelectrical multi-layers for MEMS actuators.

A method in accordance with the proposed concept can be performed in a rapid and cost-effective manner since by way of example it is no longer necessary to interrupt the vacuum for each individual structuring of the electrodes, so that it is possible to avoid the risk of an oxidation contamination of the surface that could otherwise influence the further growth of crystalline layers. Furthermore, it is possible to far exceed the deposition rates of approx. 200 nm/min and possible PZT layer thicknesses of 100 nm that can be achieved using conventional methods. In addition, the process time can also be extremely reduced by virtue of the fact that the time expended for re-creating the vacuum can be eliminated. Advantages with respect to time and cost arise when using the proposed approach also in comparison to a method wherein the entire layer stack is deposited and subsequently each electrode layer or rather PZT layer is structured individually. The reason for this is that in the case of the proposed method, the number of lithography steps is no longer tied to the number of layers. It is possible without great expense to produce a multi-layer that has five or more layers. In addition, the proposed concept renders it possible to create a good structure and consequently a high resolution.

A method is proposed for producing a multi-layer electrode system, wherein the method comprises the following steps:
providing a carrier substrate that has a recess in an upper face of the carrier substrate, wherein at least one wall of the recess is embodied in an inclined manner with respect to a lower face of the carrier substrate, said lower face lying opposite to the upper face; and
applying to the upper face of the carrier substrate a multi-layer stack that comprises at least one first electrode layer, a second electrode layer and a piezoelectrical layer that is arranged between the first electrode layer and the second electrode layer, wherein at least the wall and a base of the recess are covered by at least one section of the multi-layer stack in order to form the multi-layer electrode system.

The method can be implemented by a suitable apparatus in a mechanical and computerized manner whilst maintaining a vacuum, by way of example whilst using a suitable computer program product. The steps of providing a carrier substrate and applying a multi-layer stack can be performed in suitable devices of the apparatus. In the case of the multi-layer electrode system, this can be by way of example an actuator for a microsystem or rather for an MEMS system (micro-electro-mechanical system). Alternatively, the multi-layer electrode system can also be a sensor or generator. The carrier substrate can be a bar-shaped or planar cylindrical structure that can be embodied in order to support the multi-layer stack and to provide the multi-layer electrode system with a general shape and handling possibility. The carrier substrate can be embodied by way of example from silicon. The recess can be produced—for example in a suitable step of the method—by means of a type of process of etching a structure on a surface of the carrier substrate on the upper face. The upper face of the carrier substrate can be a main face of the carrier substrate, in other words a face that has a larger surface area opposite in a transverse manner to the same extending faces of the carrier substrate. The lower face of the carrier substrate that lies opposite the upper face can be embodied in a parallel manner or almost parallel manner with respect to the upper face. The upper face and the lower face of the carrier substrate can be embodied as planar surface areas. A cuboid-shaped carrier substrate can be in the case of the wall of the recess a total of four walls that can also have the same inclination with respect to the base of the recess. If the carrier substrate is embodied in a cylindrical manner, the wall can comprise a shape of a funnel that forms an entire wall surface of the recess. Irrespective of a shape of the recess, this can be embodied in such a manner that its opening in the carrier substrate is always greater than its base, in other words the recess is always in the shape of a funnel. The base of the recess can extend in a parallel manner or almost parallel manner with respect to the lower face of the carrier substrate. An angle of tilt between the at least one inclined wall and the base of the recess or rather the lower face of the carrier substrate amounts to between one and 90 degrees. In particular, the angle of tilt can amount to 45 degrees or almost 45 degrees. The first electrode layer, the second electrode layer and the piezoelectrical layer can be embodied as very thin layers or films that are laid one on top of the other. Thus, the first electrode layer and the second electrode layer can comprise for example a thickness in the region of 100 nm and the piezoelectrical layer can comprise for example a thickness in the range of 500 nm to 1 µm. The individual layers of the multi-layer stack can be applied for example by means of a process of deposition on the upper surface of the carrier substrate. By way of example, the first electrode layer can be embodied as a cathode and the second electrode layer as an anode in order to apply an electrical voltage to the piezoelectrical layer that is arranged between said first and second electrode layer or in order to capture an electrical voltage from a deformation of the piezoelectrical layer. The first and the second electrode layer can be embodied from a suitable metal, whereas the piezoelectrical layer can be embodied from a material that is suitable—based on the piezo effect—in order to deform as an electrical voltage is applied or as a result of a deformation to generate an electrical voltage. The first electrode layer, the second electrode layer and the piezoelectrical layer can be embodied—in dependence upon a shape of the carrier substrate—for example in a rectangular or circular shape. The multi-layer stack can be embodied in such a manner that a main extension of the first electrode layer, of the second electrode layer and of the piezoelectrical layer is aligned in a parallel manner with respect to a main extension of the lower face of the carrier substrate or rather of the base of the recess. The multi-layer stack can also be embodied from a plurality of first electrode layers, second electrode layers and piezoelectrical layers, wherein the final arrangement is always in a stack so that a piezoelectrical layer is arranged between a first electrode layer and a second electrode layer.

In accordance with one embodiment of the method, it is possible during the application step to apply a multi-layer stack moreover to an edge region of this upper face of the carrier substrate, said edge region being adjacent to the recess. The step of applying a multi-layer stack can comprise in particular a part step of removing the multi-layer stack down to a level of the upper face of the carrier substrate in order to form a planar contacting surface area with the upper face in order to make electrical contact with the first electrode and the second electrode. In so doing, in particular a lateral surface of the first electrode layer can provide a connecting region for a first contact and a lateral surface of the second electrode layer can provide a connecting region for a second contact. The adjacent edge region can be formed in such a manner that it surrounds the recess in an annular manner. By way of example, the multi-layer stack can be applied to the upper face of the carrier substrate in such a manner that it covers the entire recess and also the entire edge region. The part step of removing the multi-layer stack can be performed by way of example by means of a suitable process of grinding down the section of the multi-layer stack that lies on the edge region. As a result of removing part of the multi-layer stack, it is possible to configure the multi-layer stack in such a manner that the first and the second electrode layer and the piezoelectrical layer are cut away in an inclined manner as a result of their angled positioning on the inclined wall of the recess. The planar contacting surface area with the upper face can extend in a parallel manner with respect to the lower face of the carrier substrate or rather the base of the recess. The electrode lateral surfaces of the first electrode layer and of the second electrode layer can extend in a perpendicular manner or a transverse manner with respect to the main extension of the first and second electrode layer. The electrode lateral surfaces of the first electrode layer and of the second electrode layer can provide in each case an annular connecting region for the first or second contact respectively. The first and second contact can be configured so as to make electrical contact with the multi-layer electrode system.

In accordance with a further embodiment, the method can comprise a step of passivating the multi-layer stack. In so doing, a passivation layer can be applied to the multi-layer electrode system in a first part step of a passivation process and a region of the passivation layer can be removed in a second part step of the passivation process in such a manner that at least one contact path is formed that extends in an advantageous acute angle with respect to the lateral surface of the first electrode layer and to the lateral surface of the second electrode layer, said contact path can form a first contact surface area for a first contact by means of revealing a section of the connecting region and by means of revealing a section of the connecting region can form a second contact surface area for a second contact. The second contact surface area can be offset in particular with respect to the first contact surface area. The passivation layer can be configured so as to provide the multi-layer electrode system with a galvanic insulation, so that undesired electrical short circuits cannot occur. The passivation layer can be applied by means of a deposition process similar to the application of layers of the multi-layer stack. The passivation layer can be applied in such a manner that the entire upper face of the carrier substrate is covered by the multi-layer stack that is arranged on said upper face. The acute angle in which the contact path is advantageously formed with respect to the electrode electrode lateral surfaces of the first and second electrode layer can be by way of example 45 degrees. As a consequence of the inclined profile of the contact path with respect to the electrode lateral surfaces of the first and second electrode layer, the first contact surface and the second contact surface can comprise a shape of a parallelogram. It is possible, using the offset arrangement of the first and second contact surface area that can be achieved as result of this shape of the contact path, to achieve in an advantageous manner that the first and second contact surface area are further spaced apart from one another than would be the case if the contact path were to be applied in a perpendicular manner with respect to the electrode lateral surfaces of the first and second electrode layer. Consequently, the process of making electrical contact with the electrode layers can be performed in a simple and interference-free manner.

In particular, it is possible to form the contact path during the passivation step in such a manner that said contact path extends at an acute angle with respect to the multi-layer stack. By way of example, the contact path can extend between one corner of the contacting surface area and a further corner of the contacting surface area that lies diagonally opposite the first corner. This embodiment provides the advantage that all electrode layers of a multi-layer stack can be revealed by means of the contact path so as to achieve an electrical contact.

Moreover, it is possible during the passivation step to form at least one further contact path that extends within a tolerance range in a parallel manner with respect to the contact path. This tolerance range can comprise by way of example a deviation of 20 degrees from a precise parallel alignment of the contact path and the further contact path. It is thus possible in an advantageous manner to create the facility for additional contacts to contact the first electrode layer and the second electrode layer so that an electrical current can be transferred in a particularly safe and robust manner between the electrodes and a current source that is arranged outside the multi-layer electrode system. In the case of this embodiment of the method, the first contact surface area and the second contact surface area are formed in such a manner that they are composed of corresponding respective part contact surface areas that are interrupted by the passivation layer. The respective part contact surface areas can comprise an identical shape. This embodiment renders it possible to produce a multi-layer electrode system that has redundant contacting facilities. If one contact should fail, its function can be assumed by one or multiple further contacts.

In accordance with a further embodiment, the method can comprise a step of making an electrically conductive contact, in that a first contact is placed in a transverse manner with respect to the contact path on the multi-layer electrode system in such a manner that said first contact electrically contacts the first contact surface area and a second contact is placed in a transverse manner with respect to the contact path on the multi-layer electrode system in such a manner that said second contact electrically contacts the second contact surface area. The first contact and the second contact can be placed on the multi-layer electrode system in a parallel manner with respect to one another. It is possible as a result of the inclined profile of the contact path to arrange said contacts sufficiently far away from one another in order to ensure the electrical separation of the two electrodes of the multi-layer electrode system.

In particular, it is possible during the step of making electrical contact to place the first contact and the second contact on the multi-layer electrode system within a tolerance range in a perpendicular manner with respect to the contact path. This tolerance range can be selected by way of example in such a manner that it comprises a range of 20 degrees deviation of a precisely perpendicular alignment of the first contact and of the second contact with respect to the contact path. It is thus possible in a simple manner to ensure a maximum spacing between the first and the second contact of the multi-layer electrode system. The contacts can also be readily configured sufficiently wide in order to be able to reach the entire surface area of the first and second contact surface area.

In accordance with a further embodiment of the method, it is possible during the step of making electrical contact to place at least a further first contact and at least a further second contact on the multi-layer electrode system in such a manner that the further first contact makes electrical contact with the first contact surface area and the further second contact makes electrical contact with the second contact surface area. By way of example, the first contact and the second contact can each be configured in a rod-shaped manner so that they extend over the contacting surface area and can contact a plurality of electrode layers if the multi-layer stack comprises such a plurality of electrode layers. Consequently, it is possible in an advantageous manner to ensure a robust and redundant electrical contact with the multi-layer electrode system.

By way of example, the method can further comprise a step of forming the recess in the upper face of the carrier substrate, in particular wherein the recess can be formed by means of a process of etching a structure on the upper face of the carrier substrate. The process of etching a structure can be for example a wet-chemical etching process or a DRIE (deep reactive ion etching) process of creating trenches. The process step of etching a structure has the advantage that it can be performed in a simple and cost effective manner.

An apparatus for producing a multi-layer electrode system comprises the following features:

a device for providing a carrier substrate that has a recess in an upper face of the carrier substrate, wherein at least one wall of the recess is embodied in an inclined manner with respect to a lower face of the carrier substrate, said lower face lying opposite to the upper face; and a device for applying to the upper face of the carrier substrate a multi-layer stack that comprises at least one first electrode layer, a second electrode layer and a piezoelectrical layer that is arranged between the first electrode layer and the second electrode layer, wherein the device is configured so as to cover at least the wall and a base of the recess by at least one section of the multi-layer stack in order to form the multi-layer electrode system.

The apparatus can be configured so as to perform or rather implement the steps of a variant of the proposed method in the corresponding devices. The object of the disclosure can also be achieved in a rapid and efficient manner by virtue of this design variant of the disclosure in the form of an apparatus.

Also of advantage is a computer program product having a program code that can be stored on a machine readable carrier such as a semi-conductor storage device, a hard drive storage device or an optical storage device and is used to perform or control steps of the method according to any one of the previously described embodiments if the program product is implemented on a computer or an apparatus.

BRIEF DESCRIPTION OF THE DRAWINGS

The disclosure is further explained in an exemplary manner hereinunder with reference to the attached drawings, in which.

DETAILED DESCRIPTION

In the following description of preferred exemplary embodiments of the present disclosure, like or similar reference numerals are used for the elements that are illustrated in different figures and function in a similar manner, wherein a repeated description of these elements is not provided.

Figure 1:
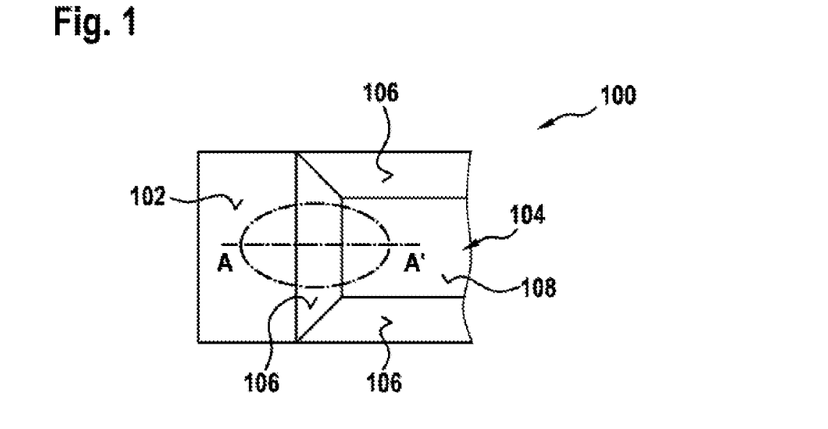
FIG. 1 illustrates a plan view of a carrier substrate in accordance with an exemplary embodiment of the present disclosure.

FIG. 1 illustrates in a plan view a section of an exemplary embodiment of a carrier substrate 100 for a multi-layer electrode system. The carrier substrate 100 is embodied in this case from silicon. An upper face 102 of the carrier substrate 100 comprises a recess 104 that has a first, second and third wall 106 and also a base 108. The recess 104 has been formed by means of a process of etching a structure, in this case a KOH etching process. Alternatively, it is also possible to form the recess 104 using other methods of wet-chemical silicon etching, for example TMAH or isotropic Si-etching, or also the DRIE process of etching trenches. As illustrated in FIG. 1, the first, second and third wall 106 of the recess 104 are inclined. A fourth wall of the recess 104, not illustrated in FIG. 1, is inclined in the case of the illustrated exemplary embodiment of the carrier substrate 100. The inclination of all walls 106 is identical. It can also differ in the case of other exemplary embodiments. As the illustration in FIG. 1 shows, both the carrier substrate 100 and also the recess 104 in the case of the illustrated exemplary embodiment have a rectangular shape. Alternatively, round shapes of the carrier substrate 100 and/or the recess 104 are also possible.

Figure 2:
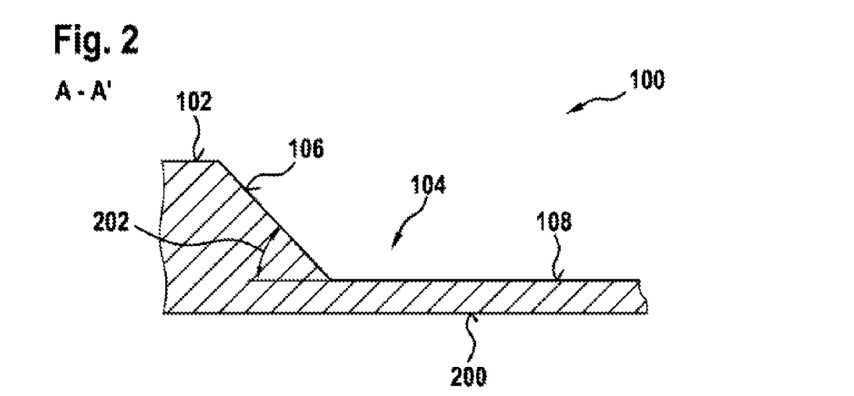
FIG. 2 illustrates a lateral view of a section of the carrier substrate shown in FIG. 1.

FIG. 2 illustrates in a lateral view a section of the carrier substrate 100 shown in FIG. 1 along a line A-A'. The illustration clearly shows the shape of the recess 104. It is evident that the base 108 of the recess 104 extends in a parallel manner with respect to the upper face 102 and also with respect to a lower face 200 of the carrier substrate 100, said lower face being parallel to the upper face 102. The figure clearly shows in particular the inclination of the walls 106. As the illustrate shows, the inclined wall 106 is arranged at a tilt angle 202 with the lower face 200 of the carrier substrate 100. The tilt angle or rather the edge angle 202 is configured in such a manner that it renders it possible to reliably coat all surfaces 106, 108 of the recess 104 with materials of the target structure of a multi-layer electrode system that is to be formed. An acute angle is particularly suitable in this case. The tilt angle 202 amounts to approx. 45 degrees in the case of the exemplary embodiment of the carrier substrate 100 illustrated in FIGS. 1 and 2.

Figure 3:
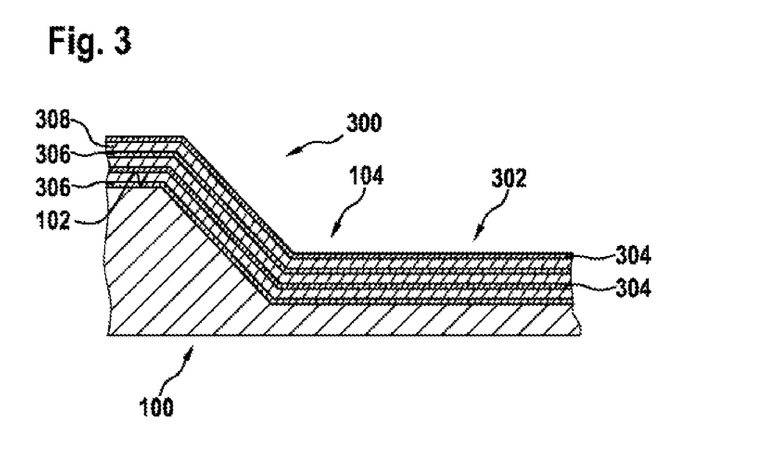
FIG. 3 illustrates cross-sectional view of a section of a multi-layer electrode system in accordance with an exemplary embodiment of the present disclosure.

FIG. 3 illustrates in a further cross-sectional view the section of the carrier substrate 100 shown in FIG. 2. A layer stack or rather multi-layer stack 302 is arranged on the carrier substrate 100 in order to form an exemplary embodiment of a multi-layer electrode system 300. The multi-layer stack 302 comprises a first electrode layer 304, a second electrode layer 306, a further first electrode layer 304 and a further second electrode layer 306. A piezoelectrical layer 308 is arranged in each case in a sandwich-like manner between the individual electrode layers 304, 306. As the illustration in FIG. 3 shows, the multi-layer stack 302 uniformly covers the entire recess 104 without forming a hollow space and also covers the edge region of the upper face 102 of the carrier substrate 100, said edge region being adjacent to the recess. The electrodes or rather the electrode layers 304 and 306 and the piezoelectrical layer or rather the piezoelectrical layers 308 have been deposited in an alternate manner during a step of a method of producing the multi-layer electrode system 300. The exemplary embodiment of the multi-layer electrode system 300 illustrated in FIG. 3 uses PZT (lead-zirkonate-titanate) in the case of the piezoelectrical layer 308 but other materials that have piezoelectric characteristics can also be used. In order to operate the piezoelectrical multi-layers 308 close to the breakdown strength with the lowest possible voltages, layer thicknesses of the piezoelectrical layer 308 in the range of 500 nm to 1 µm are preferred, the layer thicknesses are adjusted accordingly for other applications. The electrodes 304, 306 are to have as little as possible influence on the mechanical characteristics of the layer stack 302 and as long as it is electrically possible they are kept very thin, in the region of 100 nm. As a consequence, a layer structure 302 is created as is illustrated by the cross-section in FIG. 3.

Figure 4:
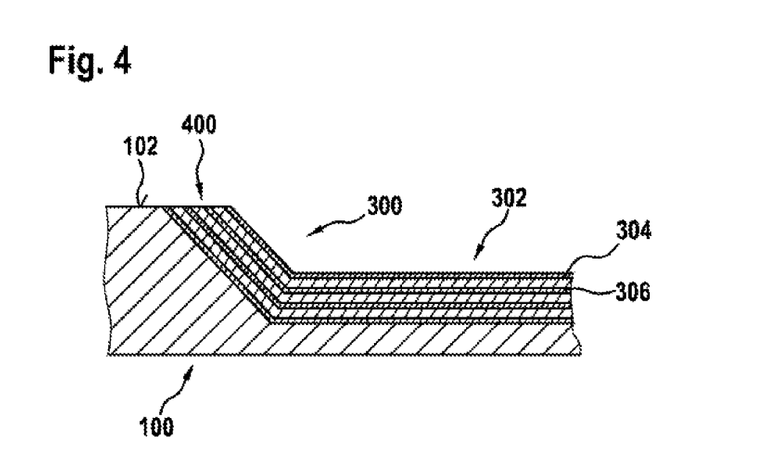
FIG. 4 illustrates a cross-sectional view of the section of the multi-layer electrode system shown in FIG. 3 after a region of the multi-layer stack has been removed, in accordance with one exemplary embodiment of the present disclosure.

FIG. 4 illustrates in turn in a cross-sectional view the section of the multi-layer electrode system 300 shown in FIG. 3 after a step of removing a region of the multi-layer stack 302. As the illustration in FIG. 4 shows, as a result of an appropriately grinding down process in the step of removing a region of said multi-layer stack, such as for example by means of CMP (chemical mechanical polishing) down to the level of the substrate surface 102, the first electrodes 304 and second electrodes 306 are accessible from above and can be contacted. As the illustration in FIG. 4 shows, the multi-layer stack 302 is now cut into in an inclined manner and thus forms a planar contacting surface area 400 for connecting electrical contacts to the multi-layer electrode system 300.

Figure 5:
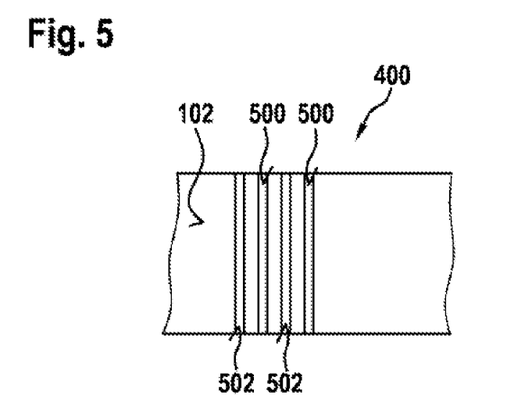
FIG. 5 illustrates a plan view of the section of the multi-layer electrode systems shown in FIG. 4.

FIG. 5 illustrates in a planar view the contacting surface area 400 of the multi-layer electrode system. It is particularly easy to see from this perspective that as a result of the step of removing a region of said multi-layer stack in each case a lateral surface 500 of the first and of the further first electrode layer and also in each case a lateral surface 502 of the second and of the further second electrode layer are accessible for connecting an electrical contact. At this point in time during the method of producing the multi-layer electrode system 300, there follows merely a process of depositing an electrically insulating passivation layer and providing a structure thereto and also making contact with the electrodes 304, 306 by way of contact hole openings. This will be mentioned in more detail with reference to the following figures.

Figure 6:
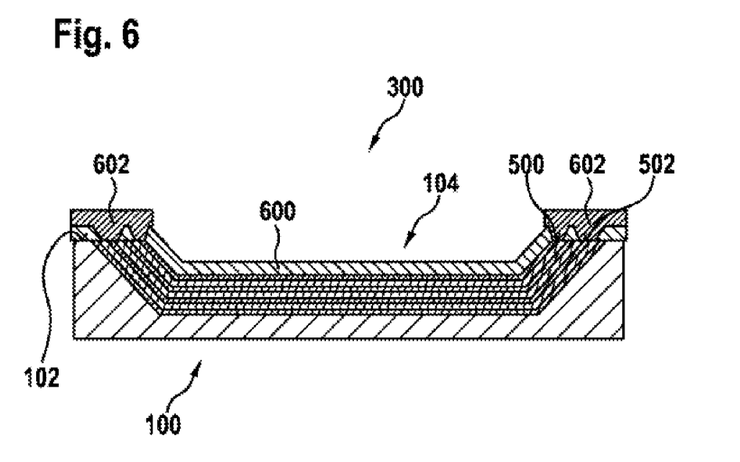
FIG. 6 illustrates a cross-sectional view of the multi-layer electrode system having contacts, in accordance with an exemplary embodiment of the present disclosure.

FIG. 6 illustrates with reference to a further cross-sectional view the entire exemplary embodiment of the multi-layer electrode system 300 including a contacting arrangement. Consequently the illustration in FIG. 6 shows the multi-layer electrode system 300 after the production process. As a result of a passivation step and a step of making electrical contact, the multi-layer electrode system 300 is now provided with a passivation layer 600. The passivation layer 600 covers the entire upper face 102 of the carrier substrate 100 including the recess 104 and is open at appropriate sites in order to make the electrode lateral surfaces 500, 502 of the electrode layers accessible for being contacted by contacts 602.

With reference to the following FIGS. 7 and 8, the passivation step and the step of making electrical contact with the multi-layer electrode system 300 are clearly explained with reference to the illustrations relating to the results of the process steps.

Figure 7:
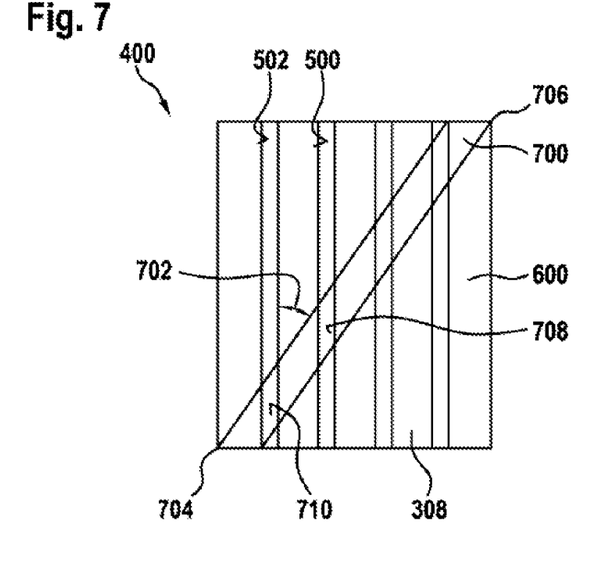
FIG. 7 illustrates a plan view of a passivation layer of the multi-layer electrode system, in accordance with an exemplary embodiment of the present disclosure.

FIG. 7 illustrates in a plan view the section of the multi-layer electrode system 300 shown in FIG. 4 with the passivation layer 600 arranged and structured thereon, in accordance with an exemplary embodiment of the present disclosure. As the illustration in FIG. 7 shows, after the process step of providing a structure, the multi-layer electrode system 300 comprises a contact path 700 that extends in an acute angle 702 with respect to the electrode lateral surfaces 500 and the electrode lateral surfaces 502. The contact path 700 that is formed as a tilted opening by means of removing the passivation layer 600 extends in the case of the exemplary embodiment of the multi-layer electrode system 300 illustrated in FIG. 7 from one corner 704 of the contacting surface area 400 to a diagonally opposite further corner 706. The opening that is in the passivation layer and forms the contact path 700 creates first contact surface areas 708 for contacting the first electrode lateral surfaces 500 with a first contact and creates second contacting surface areas 710 for contacting the second electrode lateral surfaces 502 with a second contact. An alternative exemplary embodiment of the multi-layer electrode system 300 can comprise further contact paths that can extend by way of example in parallel manner with respect to the contact path 700.

In principle, the challenge is to predict the precise position of the electrodes distributed over the wafer or rather carrier structure. This is hampered on the one hand by the preferred small spacings between the electrodes or rather electrode layers of approx. 1 µm and on the other hand by their small widths of approx. 100 nm. The precise dimensions are dependent upon the tilt angle of the lateral wall or wall of the recess in the carrier substrate and the resulting geometric thickness of the deposited layers of the multi-layer stack as a result of the tilting arrangement. Furthermore, the position of the electrodes varies as a result of variations in the structuring or etching of the recess; in addition, as a result of the offset alignment of the individual masks during the deposition process a tolerance is to be expected in the positioning of the opening or openings 700 in the passivation layer and also in the contact structures that have been applied. In order to allow for the offset alignment and the process tolerances in the case of these small spacings, after the electrical passivation layer 600 has been applied said passivation layer is advantageously opened at an angle 702 to the electrodes, as the illustration in FIG. 7 clearly shows.

Figure 8:
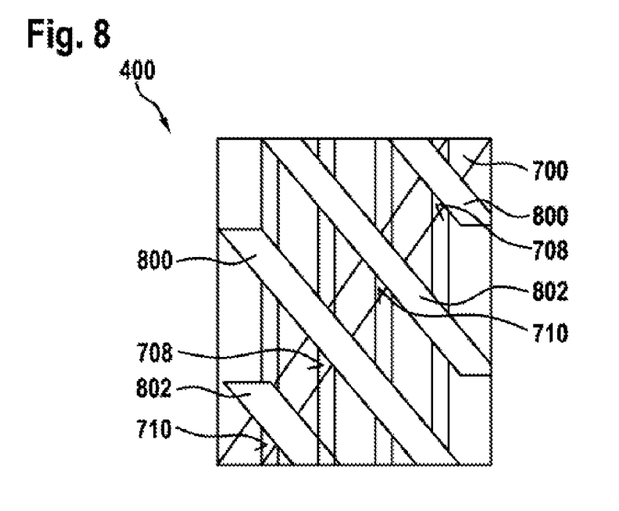
FIG. 8 illustrates a plan view of an arrangement contacting the multi-layer electrode system in accordance with an exemplary embodiment of the present disclosure.

FIG. 8 illustrates in turn in a plan view the contacting surface area 400 of the multi-layer electrode system shown in FIG. 7 after a step of making electrical contact during the process of producing the multi-layer electrode system. In this case, first contacts 800 are placed on the first contact surface areas 708 and second contacts 802 are placed on the second contact surfaces 710. As is clearly evident in the illustration in FIG. 8, the first contacts 800 and the second contacts 802 are arranged in this example in each case in a perpendicular manner with respect to the contact path 700. As the illustration in FIG. 8 shows, the first contacts 800 and second contacts 802 are embodied in each case as contacting paths. The advantageous perpendicular profile of the contacts 800, 802 with respect to the opening in the passivation layer or contact path 700 increases the spacing between the contacts 800, 802 in dependence upon the angle. Consequently, the multi-layer electrode system can be contacted with smaller manufacturing tolerances. Furthermore, the number of contacting paths or contacts 800, 802 can be selected to be greater than the number of electrodes and consequently the window of manufacturing tolerances is widened. The contacting paths 800, 802 without contact to an individual electrode are functionless and do not cause any interference.

To summarize, the FIGS. 1 to 4 explain the structuring of the layer stack or multi-layer electrode system 302 wherein the FIGS. 1 and 2 illustrate the result of the structuring of the substrate 100 so as to produce a tilted plane 106 and the FIGS. 3 and 4 illustrate the result of the alternating deposition of electrode material 304, 306 and piezo material (for example PZT) 308 for the layer stack 302 and the grinding down process and consequently the creation of horizontal access to the individual electrodes 306, 306.

The FIGS. 5 to 8 explain the contacting arrangement of the electrodes 304, 306 in the piezoelectrical layer stack 302 after the preceding structuring process by means of depositing the electrically insulating passivation layer 600 and structuring said passivation layer by means of opening contact holes 708, 710 at the angle 702 to the electrodes 304, 306 and also depositing and structuring the electrical contacting paths 800, 802. After applying and structuring the contact metallization layer, the paths 800, 802 extend in an advantageous manner perpendicularly with respect to the opening 700 of the passivation layer 600; as a consequence of which the spacings between the contacting paths 800, 802 are increased in comparison to the electrode spacings. In order to increase reliability of the electrical connection, it is also possible to structure multiple passivation openings 700 in parallel manner with respect to one another. However, attention must be given to the correct spacing and angle 702 of the rotation so that one contact path 800, 802 only makes contact with the electrodes 304, 306 of one contacting side.

Figure 9:
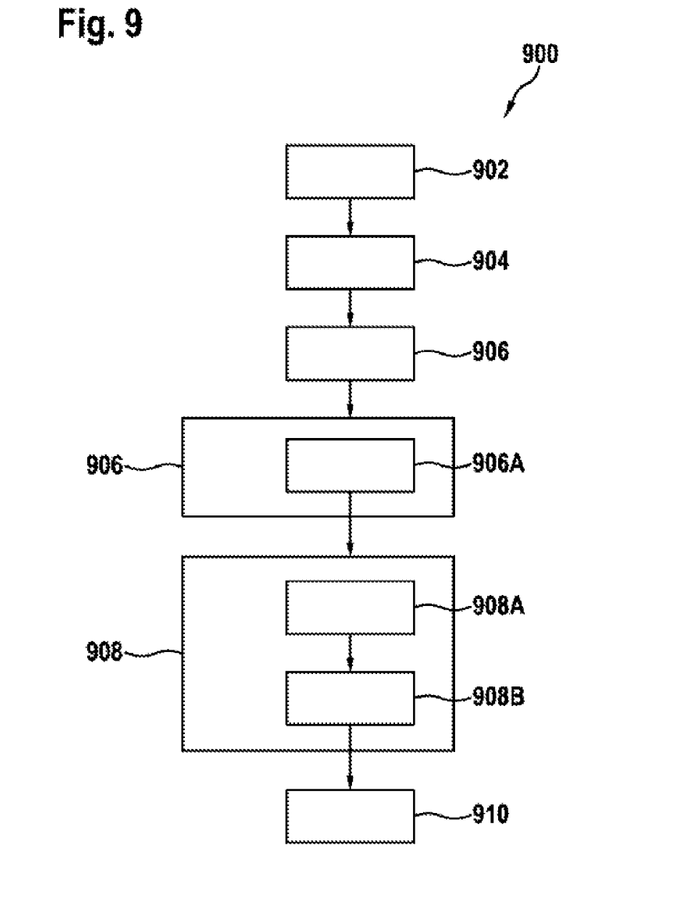
FIG. 9 illustrates a flow chart of a method for producing a multi-layer electrode system in accordance with an exemplary embodiment of the present disclosure.

FIG. 9 illustrates an exemplary embodiment of a flow chart of a method 900 for producing a multi-layer electrode system in accordance with an exemplary embodiment of the present disclosure. In step 902, a recess is provided by means of etching a structure in an upper face of a carrier substrate for the multi-layer electrode system, wherein the recess is shaped in such a manner that at least one wall of the recess is configured in an inclined manner with respect to a lower face of the carrier substrate. In step 904, the carrier substrate is presented for further processing so that in a following step 906 a multi-layer stack can be applied to the upper face of the carrier substrate. The application step 906 comprises a part step of removing 906A the multi-layer stack so as to form a contacting surface area for electrically contacting at least a first electrode and at least a second electrode of the multi-layer stack. Fundamentally, the layers of electrode, piezoelectrical layer, electrode, piezoelectrical layer etc. that are deposited in a planar manner one after the other or one on top of the other in step 906 are deflected from the horizontal profile by means of the suitable pre-structured recess in the substrate. In the subsequent step 906A, the protruding material is ground down or removed down to the level of the original substrate surface using other suitable methods. As a consequence, it is then possible to have access from above in a planar manner to the individual electrodes. In step 908, the multi-layer stack is structured. The step 908 comprises a part step 908A of depositing an electrically insulating passivation layer onto the multi-layer electrode system and a part step 908B of removing a region of the passivation layer so as to form at least one contact path having contact hole openings for contacting the electrodes. The contact path is preferably created at a first flat angle with respect to the edge of the original substrate surface. In step 910, the multi-layer electrode system is electrically contacted in that at least one first contact is placed in a transverse manner with respect to the contact path on the multi-layer electrode system in such a manner that said first contact electrically contacts a first contact surface area and at least one second contact is placed in a transverse manner with respect to the contact path on the multi-layer electrode system in such a manner that said second contact electrically contacts a second contact surface area of the second electrode.

A multi-layer electrode system that is produced from piezoelectrical multi-layers with the method 900 whereby electrodes are contacted using microsystems technology has a structure that comprises:

the recess in the substrate in which the multi-layer stack is located, said multi-layer stack extending over the lateral walls as far as the surrounding substrate level—wherein the stacked layers of the multi-layer stack are cut into, an insulation layer that is located thereon and comprises contact openings that preferably extend at a first flat angle with respect to the edge of the recess, and contact feed lines at a second angle with respect thereto.

FIGS. 1 to 9 explain a structure or rather an effective method for contacting piezoelectrical thin-film stacks. However, the principle can be easily transferred to other applications that can be achieved in an advantageous manner with multi-layer vertically layered inter-digital electrodes, such as for example thin-layer battery stacks or gas sensors. A particular aspect is the fact that the method is relatively insensitive to the number of multi-layers that are to be contacted, in other words it is easy to scale to suit many layers.

The challenge associated with thin-film technology of contacting individual electrodes in order to create a multi-layer actuator or rather multi-layer sensor can be successfully met using the proposed approach. The proposed approach renders it possible to develop a piezoelectrical multi-layer actuator that has a low drive voltage and whose production process is compatible with MEMS processes, and said multi-layer actuator can represent a serious competitor to the hitherto sole established and fully integrated electrostatic MEMS actuator.

The proposed concept can be used in the development for example of MEMS energy harvesters or contacting piezoelectrical membranes and bending beam sensors or rather bending beam actuators. Further application areas are to be found in the series connection of micro-batteries (solid electrolyte intermediate layers in lieu of PZT, active battery materials) and when contacting individual layers of integrated compact capacitors.

The exemplary embodiments described and illustrated in the figures are only selected by way of example. Different exemplary embodiments can be combined with one another fully or with regard to individual features. Also, an exemplary embodiment can be supplemented by features of a further exemplary embodiment.

Moreover, method steps in accordance with the disclosure can be repeated and also performed in a different sequence to that described.

If an exemplary embodiment comprises an "and/or" operation between a first feature and a second feature, then this is to be understood that the exemplary embodiment in accordance with one design comprises both the first feature and also the second feature and in accordance with a further embodiment either only the first feature or only the second feature.

The invention claimed is:

1. A method for producing a multi-layer electrode system, the method comprising:

applying a multi-layer stack to an upper face of a carrier substrate, the carrier substrate having a recess in the upper face, at least one wall of the recess inclined with respect to a lower face of the carrier substrate, the lower face lying opposite to the upper face, the multi-layer stack including at least one first electrode layer, a second electrode layer and a piezoelectrical layer that is arranged between the at least one first electrode layer and the second electrode layer; and covering at least the wall and a base of the recess with at least one section of the multi-layer stack in order to form the multi-layer electrode system, wherein:

applying the multi-layer stack includes:

applying the multi-layer stack to an edge region of the upper face of the carrier substrate, said edge region being adjacent to the recess; and removing the multi-layer stack down to a level of the upper face of the carrier substrate in order to form a planar contacting surface area with the upper face in order to make electrical contact with the at least one first electrode layer and the second electrode layer.

2. The method as claimed in claim 1, wherein:

a lateral surface of the at least one first electrode layer provides a connecting region for a first contact and a lateral surface of the second electrode layer provides a connecting region for a second contact.

3. The method in accordance with claim 2, further comprising:

applying a passivation layer to the multi-layer stack of the multi-layer electrode system; and removing a region of the passivation layer so as to form at least one contact path that extends at an acute angle with respect to the lateral surface of the at least one first electrode layer and to the lateral surface of the second electrode layer, wherein said at least one contact path forms a first contact surface area for the first contact by revealing a section of the connecting region and forms a second contact surface area for the second contact by revealing a section of the connecting region.

4. The method as claimed in claim 3, wherein the at least one contact path is formed so as to extend at an acute angle with respect to the multi-layer stack.

5. The method as claimed in claim 3, further comprising:

forming at least one further contact path within a tolerance range in a parallel manner with respect to the at least one contact path.

6. The method as claimed in claim 3, further comprising:

producing an electrically conductive contact in which the first contact is placed in a transverse manner with respect to the at least one contact path in such a manner on the multi-layer electrode system that said first contact electrically contacts the first contact surface area and the second contact is placed in a transverse manner with respect to the at least one contact path on the multi-layer electrode system in such a manner that said second contact electrically contacts the second contact surface area.

7. The method as claimed in claim 6, wherein the first contact and the second contact are placed within a tolerance range in a perpendicular manner with respect to the at least one contact path on the multi-layer electrode system.

8. The method as claimed in claim 6, wherein at least a further first contact and at least a further second contact are placed on the multi-layer electrode system in such a manner that the further first contact electrically contacts the first contact surface area and the further second contact electrically contacts the second contact area.

9. The method in accordance with claim 3, wherein the second contact surface area is arranged offset with respect to the first contact surface area.

10. The method as claimed in claim 1, further comprising:

forming the recess in the upper face of the carrier substrate by etching a structure in the upper face of the carrier substrate.

11. The method as claimed in claim 1, wherein the applying the multi-layer stack and covering at least the wall and the base of the recess are carried out via a computer program product having a program code for performing or controlling steps of the applying the multi-layer stack and covering at least the wall and the base of the recess.

* * * * *